United States Patent
Zhan

(10) Patent No.: US 7,936,224 B2
(45) Date of Patent: May 3, 2011

(54) VOLTAGE CONTROLLED OSCILLATOR

(75) Inventor: Jing-Hong Conan Zhan, HsinChu (TW)

(73) Assignee: Mediatek Inc., Hsin-Chu (TW)

( * ) Notice: Subject to any disclaimer, the term of this patent is extended or adjusted under 35 U.S.C. 154(b) by 37 days.

(21) Appl. No.: 12/107,196

(22) Filed: Apr. 22, 2008

(65) Prior Publication Data

US 2009/0261876 A1 Oct. 22, 2009

(51) Int. Cl.
*H03B 5/12* (2006.01)

(52) U.S. Cl. ............... 331/36 L; 331/117 R; 331/177 V; 331/181

(58) Field of Classification Search .................. 331/36 L, 331/36 C, 117 R, 117 FE, 167, 181, 177 V
See application file for complete search history.

(56) References Cited

U.S. PATENT DOCUMENTS

| | | | |
|---|---|---|---|
| 6,621,363 B2 | 9/2003 | Park et al. | |
| 6,621,365 B1 | 9/2003 | Hallivuori et al. | |
| 6,822,434 B2 | 11/2004 | Haslett et al. | |
| 6,859,112 B2 * | 2/2005 | Mason | 331/117 FE |
| 6,982,605 B2 | 1/2006 | Mondal et al. | |
| 7,154,349 B2 * | 12/2006 | Cabanillas | 331/117 R |
| 7,557,664 B1 * | 7/2009 | Wu | 331/51 |
| 7,633,352 B2 * | 12/2009 | El Rai | 331/181 |
| 2006/0055470 A1 * | 3/2006 | Luong et al. | 331/36 L |
| 2007/0030080 A1 * | 2/2007 | Han et al. | 331/18 |
| 2007/0146088 A1 * | 6/2007 | Arai et al. | 331/167 |

OTHER PUBLICATIONS

Gagliolo, et al.; "Phase Noise Performances of a Cross-Coupled CMOS VCO with Resistor Tail Biasing"; Sep. 2005; IEEE 18th Symposium on Integrated Circuits and Systems Design; pp. 149-153.*

* cited by examiner

*Primary Examiner* — Ryan Johnson
(74) *Attorney, Agent, or Firm* — Thomas|Kayden

(57) ABSTRACT

An embodiment of the voltage controlled oscillator is provided. The oscillator comprises a first inductor set, a second inductor set, a second capacitor, a voltage source and a negative resistance element. The inductance of the second inductor set is k times the inductance of the first inductor set. The voltage source applies an ac voltage to the second inductor set. The negative resistance element is coupled to the second inductor set to provide a negative resistance to resonate the second capacitor at the second inductor set.

14 Claims, 4 Drawing Sheets

VOLTAGE CONTROLLED OSCILLATOR

BACKGROUND OF THE INVENTION

1. Field of the Invention

The invention relates to a voltage controlled oscillator, and more particularly to a voltage controlled oscillator with a transformer.

2. Description of the Related Art

The voltage controlled oscillator is a component used as a local oscillator in many wireless communication devices. With a voltage controlled oscillator circuit, a desired frequency can be easily obtained by adjusting the charging and discharging times of capacitors or capacitive elements. For this reason, a voltage-controlled oscillator circuit is normally used in an apparatus which requires different clock frequencies. Today, CMOS integrated circuits of low power consumption have become widespread. With this trend, various voltage controlled oscillator circuits of the CMOS configuration are being developed. However, an LC tank voltage controlled oscillator usually comprises a large capacitor and a small inductor. Meanwhile, parasitic capacitor effect increases due to the small inductor, resulting in phase noise in the output clock signal of the voltage controlled oscillator.

FIG. 1 is a circuit diagram of an LC oscillator. The inductor $L_1$ placed in parallel with a capacitor $C_1$ resonates at a frequency $\omega=1/\sqrt{L_1 C_1}$. At this frequency, the impedances of the inductor and the capacitor are equal and opposite. However, in practice, inductors or/and capacitors suffer from resistive components. For example, the series resistance of the metal wire in the inductor can be modeled as the resistor $R_s$ shown in FIG. 1. An infinite quality factor Q of the inductor $L_1$ is defined as $L_1\omega/R_s$. In the FIG. 1, the equivalent impedance is given by $$Z_{eq}(s) = \frac{R_s + L_1 s}{1 + L_1 C_1 s^2 + R_s C_1 s}, \quad (eq.\ 1)$$

and hence, $$|Z_{eq}(s=j\omega)|^2 = \frac{R_s^2 + L_1^2 \omega^2}{(1 - L_1 C_1 \omega^2)^2 + R_s^2 C_1^2 \omega^2}. \quad (eq.\ 2)$$

The magnitude of $Z_{eq}$ in eq. 2 reaches to a peak value in the vicinity of $\omega=1/\sqrt{L_1 C_1}$, but the actual resonance frequency is still partially dependent on $R_s$.

According to the described, controlling the resonance frequency by adjusting the capacitor $C_1$ and inductor $L_1$ should be achievable. However, in practice, the inductance of the inductor $L_1$ is not easily precisely adjusted, and the capacitor $C_1$ may suffer parasitic capacitor effect. Thus, the resonance frequency $\omega$ is unstable.

BRIEF SUMMARY OF THE INVENTION

An embodiment of the voltage controlled oscillator according to the invention is disclosed. The voltage controlled oscillator comprises a first capacitor, a first inductor, a second inductor, a third inductor, a fourth inductor, a voltage source and a negative resistance element. The first inductor comprises a first terminal coupled to the first terminal of the third inductor and a second terminal coupled to the first terminal of the first capacitor. The second inductor comprises a first terminal coupled to the first terminal of the fourth inductor and a second terminal coupled to the second terminal of the first capacitor. The second capacitor comprises a first terminal coupled to the second terminal of the third inductor and a second terminal coupled to the second terminal of the fourth inductor. The inductance of the third inductor or the fourth inductor is N times the inductance of the first inductor or the second inductor. The voltage source applies an ac voltage to the third and fourth inductors. The negative resistance element is coupled to the third and fourth inductors to provide a negative resistance.

Another embodiment of a phase locked loop device is provided. The PLL device comprises a PFD unit, a charging pump circuit, a loop filter, and a voltage controlled oscillator. The PFD unit measures a phase and a frequency difference between a reference clock signal and a feedback clock signal of the PLL device and the PFD unit outputs a difference signal UP and a difference signal DN. The charging pump circuit receives and transforms the difference signals UP and DN into a current. The loop filter receives and transforms the current into a voltage. The voltage controlled oscillator receives the voltage and outputs an output signal, wherein the voltage controlled oscillator comprises a first inductor set and a second inductor set, and the inductance of the second inductor set is k times the inductance of the first inductor set.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
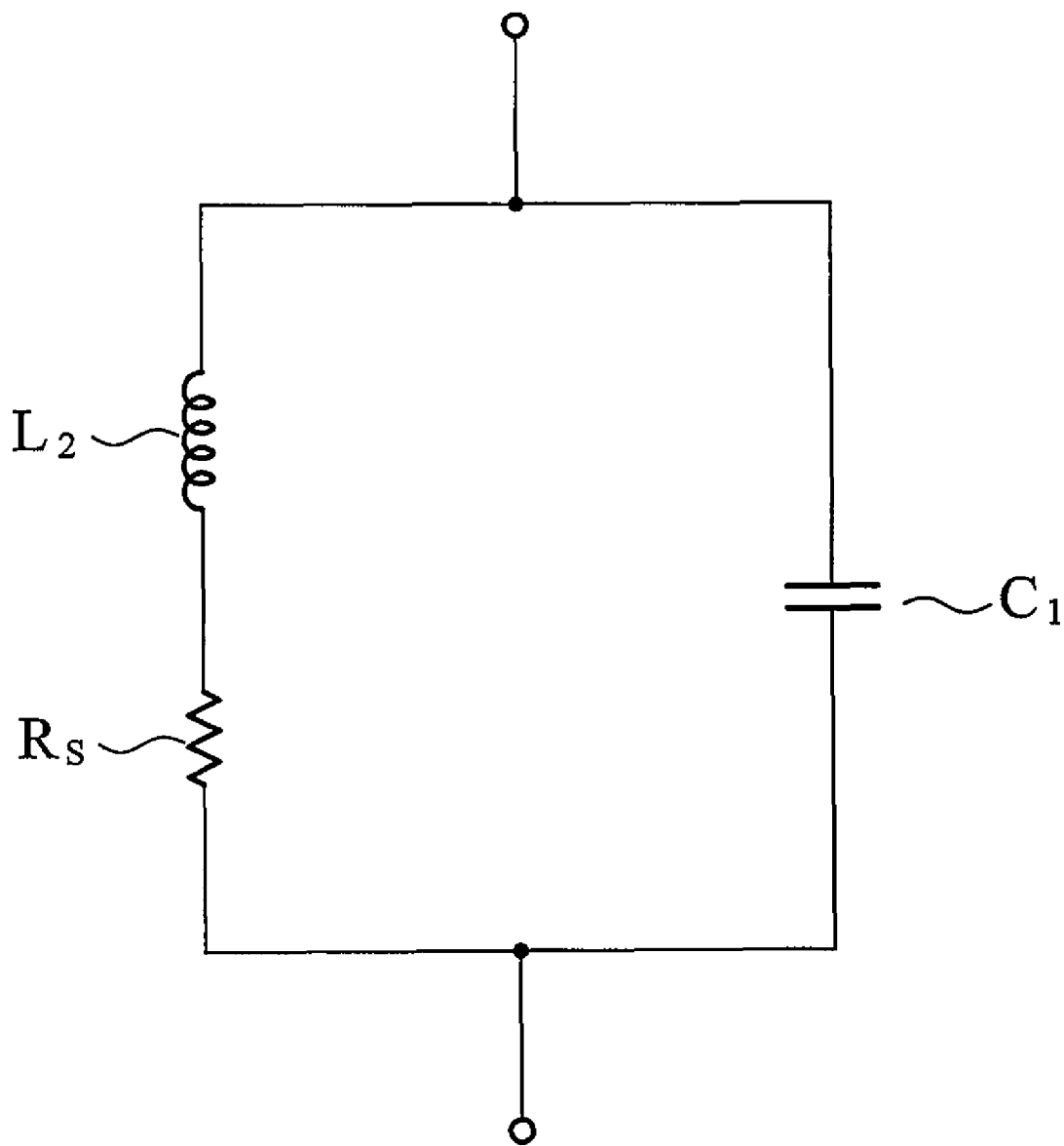
FIG. 1 is a circuit diagram of an LC oscillator.
Figure 2:
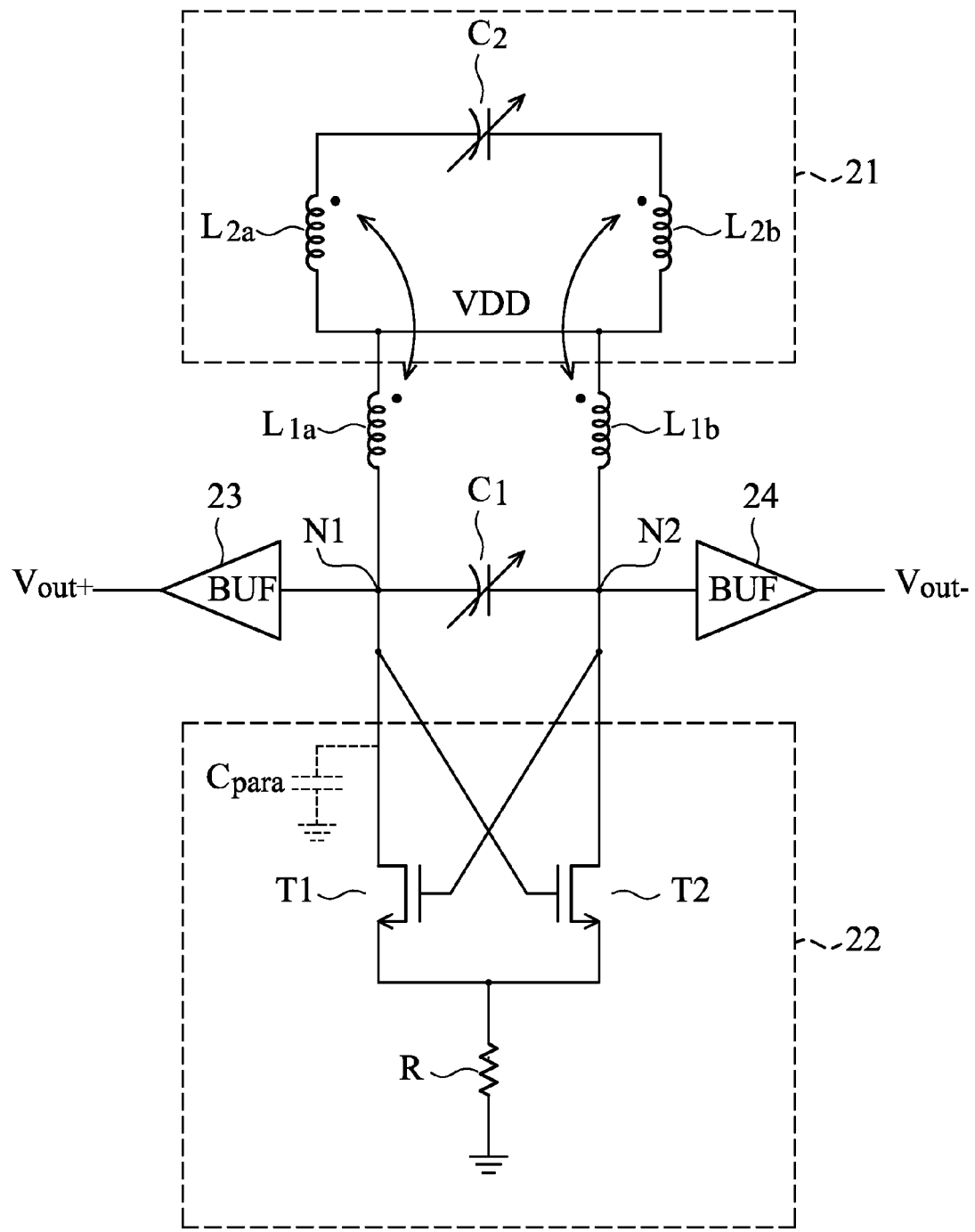
FIG. 2 is a circuit diagram of an oscillator based on an embodiment of the invention.

FIG. 2 is a circuit diagram of an oscillator based on an embodiment of the invention. The LC circuit 21 comprises an inductor $L_{2a}$, an inductor $L_{2b}$ and a second capacitor $C_2$. The inductor $L_{2a}$ comprises a second terminal and a first terminal coupled to one terminal of the second capacitor $C_2$. The inductor $L_{2b}$ comprises a first terminal coupled to another terminal of the second capacitor $C_2$, and a second terminal coupled to the second terminal of the inductor $L_2$a. The inductor $L_{2a}$ is further connected to the inductor $L_{1a}$, and the inductor $L_{2b}$ is further connected to the inductor $L_{1b}$. The inductor $L_{1a}$ comprises a second terminal and a first terminal coupled to one terminal of the first capacitor $C_1$. The inductor $L_{1b}$ comprises a first terminal coupled to another terminal of the first capacitor $C_1$, and a second terminal coupled to the second terminal of the inductor $L_1$a. In this embodiment, the inductance of the inductor $L_{1a}$ is N times the inductance of the second inductor $L_{2a}$, and the inductance of the inductor $L_{1b}$ is N times the inductance of the second inductor $L_{2b}$. In this embodiment, the inductors $L_{1a}$, $L_{1b}$, $L_{2a}$ and $L_{2b}$ receive the same voltage $V_{DD}$. A negative resistance element 22 is coupled to the inductors $L_{1a}$ and $L_{1b}$ to provide a negative resistance to resonate the inductors $L_{1a}$, $L_{1b}$ and the first capacitor $C_1$. The negative resistance element 22 comprises a first transistor and a second transistor. The first transistor T1 comprises a first input terminal coupled to the first clock output terminal N1, a first output terminal, and a first control terminal coupled to the second clock output terminal N2. The second transistor T2 comprises a second input terminal coupled to the second clock output terminal N2, a second output terminal coupled to the first output terminal, and a second control terminal coupled to the first clock output terminal N1. The negative resistance element 22 further comprises a resistor R coupled between the first output terminal and ground. In this embodiment, the clock output terminal N1 and N2 are respectively coupled to the buffer 23 and 24 to output the output differential clock signal $V_{out+}$ and $V_{out-}$.

Without the inductors $L_{2a}$ and $L_{2b}$ and the second capacitor C2, the resonance frequency is $\omega=1/\sqrt{L_1(C_1+C_{para})}$. With the inductors $L_{2a}$ and $L_{2b}$ and the second capacitor C2, the resonance frequency is as followed:

$$\omega_1 = 1 / \sqrt{L_1(C_1 + C_{para})_{refered\_to\_first\_inductor}}$$

$$= 1/L_1 \cdot \left(\frac{C_{para} + C_1}{N^2}\right)_{refered\_to\_second\_inductor}$$

The parasitic capacitor $C_{para}$ is generated at the input terminal of the first transistor T1. In this embodiment, only the parasitic capacitor $C_{para}$ at the input terminal of the first transistor T1 is described for illustration, while in practice, the parasitic capacitor is also generated at the input terminal of the second transistor T2. According to the resonance frequency $\omega_1$, the parasitic capacitor effect caused by the parasitic capacitor $C_{para}$ can be significantly reduced. Furthermore, inductors $L_{1a}$, $L_{1b}$ and the capacitor $C_1$ adjustments are easier.

Figure 3:
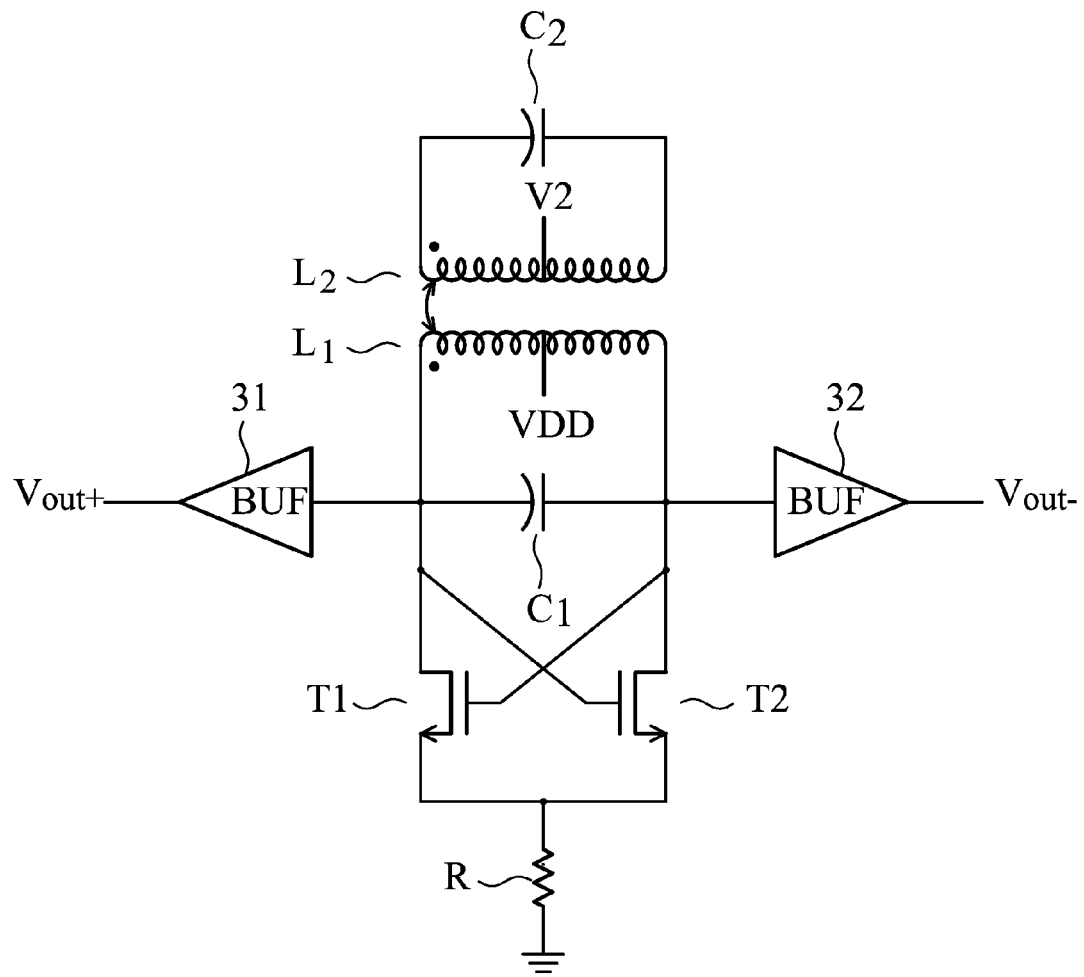
FIG. 3 is a circuit diagram of an oscillator based on another embodiment of the invention.

FIG. 3 is a circuit diagram of an oscillator based on another embodiment of the invention. The second inductor $L_2$ is further connected to a first inductor $L_1$. The first inductor $L_1$ is parallel connected to a first capacitor $C_1$. In this embodiment, the inductance of the first inductor $L_1$ is N times the inductance of the second inductor $L_2$. In this embodiment, the first inductor $L_1$ receives the voltage $V_{DD}$, and the second inductor $L_2$ receives the voltage $V_2$. In this embodiment, the capacitors $C_1$ and $C_2$ are voltage controlled capacitors and their capacitance can be adjusted respectively by the voltages $V_{DD}$ and $V_2$. The first transistor T1 and a second transistor T2 form a negative resistance element 22 which is coupled to the first inductor $L_1$ to provide a negative resistance to resonate the first inductor $L_1$ and the first capacitor $C_1$. The first transistor T1 comprises a first input terminal coupled to the first clock output terminal N1, a first output terminal, and a first control terminal coupled to the second clock output terminal N2. The second transistor T2 comprises a second input terminal coupled to the second clock output terminal N2, a second output terminal coupled to the first output terminal, and a second control terminal coupled to the first clock output terminal N1. The negative resistance element 22 further comprises a resistor R coupled between the first output terminal and ground. In this embodiment, the clock output terminal N1 and N2 are respectively coupled to the buffer 23 and 24 to output the output differential clock signal $V_{out+}$ and $V_{out-}$.

Figure 4:
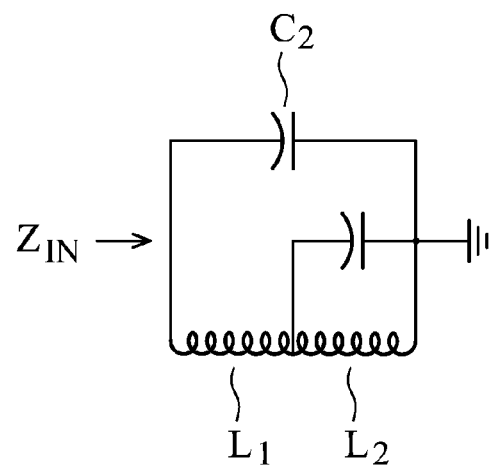
FIG. 4 is an equivalent circuit diagram of the voltage controlled oscillator shown in FIG. 2.

FIG. 4 is a schematic diagram of the input impedance to the voltage controlled transformer with transformer according to the invention. The input impedance $Z_{IN}$ is derived as following.

$$Z_{IN} = \left(sL_2 \| \frac{1}{sC_2} + sL_1\right) \| \frac{1}{sC_1}$$

$$= \left(\frac{sL_2}{sL_2 \cdot sC_2 + 1} + sL_1\right) \| \frac{1}{sC_1}$$

$$= \left(\frac{sL_2}{1 + s^2L_2C_2} + sL_1\right) \| \frac{1}{sC_1}$$

$$= \frac{\frac{sL_2}{1+s^2L_2C_2} + sL_1}{1 + sC_1\left(\frac{sL_2}{1+s^2L_2C_2} + sL_1\right)}$$

$$= \frac{(sL_2 + sL_1(1+s^2L_2C_2))}{(1+s^2L_2C_2) + sC_1(sL_2 + sL_1(1+s^2L_2C_2))}$$

The denominator part:

$$(1 + s^2L_2C_2) + sC_1(sL_2 + sL_1(1+s^2L_2C_2)) =$$

$$1 + s^2L_2C_2 + s^2(L_2+L_1)C_1 + s^4L_1L_2C_1C_2 =$$

$$1 + s^2(L_2C_2 + L_2C_1 + L_1C_1) + s^4L_1L_2C_1C_2 =$$

$$1 - \omega^2(L_2C_2 + L_2C_1 + L_1C_1) + \omega^4L_1L_2C_1C_2$$

$$\omega^2 = \frac{1}{2}\left\{\left(L_2C_2 + L_2C_1 + L_1C_1 \pm \sqrt{(L_2C_2 + L_2C_1 + L_1C_1)^2 - 4L_1L_2C_1C_2}\right)\right\}$$

In this embodiment, we only consider the high frequency response portion, i.e. with "+" sign, because the inductor Q corresponding to the low frequency is too low and the voltage controlled oscillator will still be oscillated.

$$\omega^2 = \frac{L_2C_2 + L_2C_1 + L_1C_1}{2}\left\{1 + \sqrt{1 - \frac{4L_1L_2C_1C_2}{(L_2C_2 + L_2C_1 + L_1C_1)^2}}\right\}$$

Since $\sqrt{1+x} \cong 1+0.5x$, thus, $$\omega^2 = \frac{L_2C_2 + L_2C_1 + L_1C_1}{2}\left\{1 + 1 - \frac{2L_1L_2C_1C_2}{(L_2C_2 + L_2C_1 + L_1C_1)^2}\right\}$$

$$= (L_2C_2 + L_2C_1 + L_1C_1)\left\{1 - \frac{L_1L_2C_1C_2}{(L_2C_2 + L_2C_1 + L_1C_1)^2}\right\}$$

Assuming $C_2 \ll C_1$ $$\omega^2 \cong (L_2C_1 + L_1C_1)\left\{1 - \frac{L_1L_2C_1C_2}{(L_2C_1 + L_1C_1)^2}\right\}$$

$$= L_1C_1(1+N)\left\{1 - \frac{L_1L_2C_1C_2}{(L_1C_1)^2(1+N)^2}\right\}$$

$$\cong L_1C_1(1+N)\left\{1 - \frac{L_2C_2}{L_1C_1} \cdot \frac{1}{(1+N)^2}\right\}$$

$$\cong L_1C_1(1+N) - \frac{L_2C_2}{(1+N)^2}$$

$$\frac{\partial \omega^2}{\partial C_1} \cong L_1(1+N)$$

$$\frac{\partial \omega^2}{\partial C_2} \cong -L_2 \frac{1}{(1+N)^2} = -\frac{N}{(1+N)^2}L_1$$

$$\frac{\partial \omega^2 / \partial C_1}{\partial \omega^2 / \partial C_2} \cong \frac{L_1(1+N)}{-\frac{N}{(1+N)^2}L} = -\frac{(1+N)}{\frac{N}{(1+N)^2}} \cong (1+N)^2$$

Figure 5:
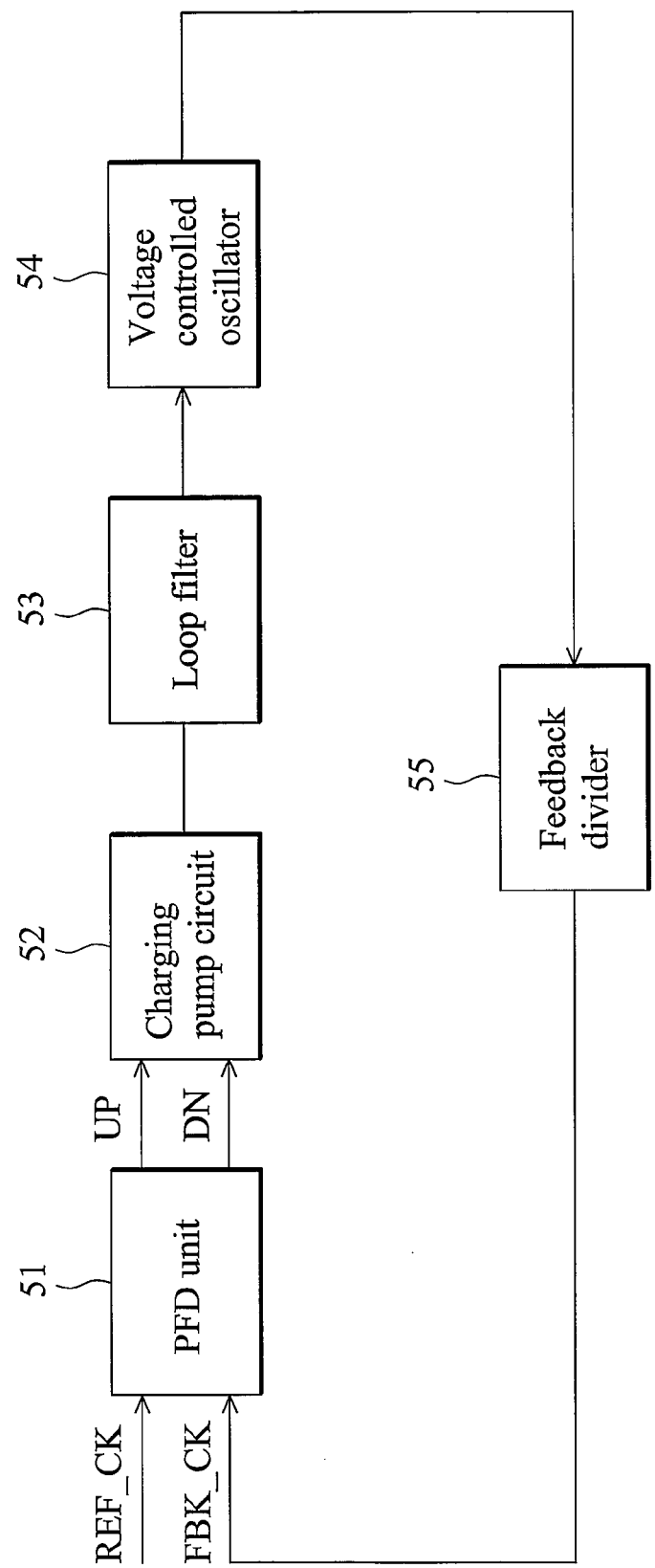
FIG. 5 is a schematic diagram of a phase locked loop device of an embodiment of the invention.

FIG. 5 is a schematic diagram of a phase locked loop device of an embodiment of the invention. PFD unit 51 receives a reference clock signal REF_CK and a feedback clock signal FBK_CK and measures the phase and frequency difference therebetween to output phase difference signals, UP and DN. Charging pump circuit 52 receives and transforms the phase difference signals UP and DN into a current to charge loop filter 53. The loop filter 53 receives the current from charging pump circuit to limit the rate of change of a capacitor voltage, VCON, resulting in slow rising or falling voltage corresponding to the phase and frequency difference. The voltage controlled oscillator (VCO) 54 generates an output clock signal according to the voltage VCON. The voltage controlled oscillator 54 comprises a first inductor and a second inductor, and the inductance of the first inductor is N times the inductance of the second inductor. Two embodiments of the voltage controlled oscillator 54 are illustrated with the oscillators shown in the FIG. 2 and FIG. 3. Feedback divider 55 has a parameter M to generate the feedback clock signal FBK_CK with wider range frequency, wherein the frequency of the feedback clock signal FBK_CK is M times the frequency of the output clock signal. In an ideal situation, when the PLL is in an in-lock state, the phase difference signal UP synchronizes to the phase difference signal DN.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage controlled oscillator, comprising:
   a tunable first capacitor having a first end and a second end;
   a first transformer winding having a first end directly connected to the first end of the first capacitor, a second end directly connected to the second end of the first capacitor and a first center tap arranged to receive a first voltage, wherein the first and second ends of the first capacitor are not directly connected to the first center tap of the first transformer winding;
   a second transformer winding coupled to the first transformer winding, wherein an inductance value of the second transformer winding is a predetermined number of times an inductance value of the first transformer winding;
   a negative resistance element directly connected to both ends of the second transformer winding to provide a negative resistance;
   a second capacitor having a first end and a second end, wherein the second transformer winding comprises a first end directly connected to the first end of the second capacitor, a second end directly connected to the second end of the second capacitor and a second center tap arranged to receive a second voltage, wherein the first voltage is equal to the second voltage.

2. The oscillator as claimed in claim 1, wherein the first capacitor is a voltage controlled capacitor.

3. The oscillator as claimed in claim 1, wherein the both ends of the second transformer winding are served as a first clock output terminal and a second clock output terminal, respectively, which are arranged to output a first clock signal and a second clock signal.

4. The oscillator as claimed in claim 3, wherein the negative resistance element comprises:
   a first transistor comprising a first input terminal coupled to the first clock output terminal, a first output terminal, and a first control terminal coupled to the second clock output terminal; and
   a second transistor comprising a second input terminal coupled to the second clock output terminal, a second output terminal coupled to the first output terminal, and a second control terminal coupled to the first clock output terminal.

5. The oscillator as claimed in claim 4, further comprising a resistor coupled between the first output terminal and ground.

6. The oscillator as claimed in claim 4, wherein the first control terminal is further coupled to a first buffer, and the second control terminal is further coupled to a second buffer.

7. The oscillator as claimed in claim 1, wherein the first transformer winding is further coupled to a voltage regulator.

8. The oscillator as claimed in claim 1, wherein the oscillator is further integrated in a phase locked loop device, including:
   a phase frequency detector unit measuring a phase difference and a frequency difference between a reference clock signal and a feedback clock signal of the phase locked loop device to output a first difference signal and a second difference signal;
   a charging pump circuit receiving and transforming the first and second difference signals into a current; and
   a loop filter receiving and transforming the current into a voltage;
   wherein the oscillator then receives the voltage and outputs an output signal.

9. The oscillator as claimed in claim 1, wherein the first capacitor is not directly connected to the first voltage.

10. The oscillator as claimed in claim 1, wherein the first and second ends of the second capacitor are not directly connected to the second center tap of the second transformer winding.

11. The oscillator as claimed in claim 1, wherein the first center tap of the first transformer winding is connected to the second center tap of the second transformer winding.

12. A voltage controlled oscillator, comprising:
   a first capacitor having a first end and a second end;
      a first transformer winding having a first end directly connected to the first end of the first capacitor, a second end directly connected to the second end of the first capacitor and a first center tap arranged to receive a first voltage;
a second transformer winding coupled to the first transformer winding;
a second capacitor having a first end and a second end, wherein the second transformer winding comprises a first end directly connected to the first end of the second capacitor, a second end directly connected to the second end of the second capacitor and a second center tap arranged to receive a second voltage, wherein the first voltage is equal to the second voltage; and
a negative resistance element directly connected to both ends of the second transformer winding to provide a negative resistance.

13. A voltage controlled oscillator, comprising:
a first capacitor having a first end and a second end;
a first transformer winding having a first end directly connected to the first end of the first capacitor, a second end directly connected to the second end of the first capacitor and a first center tap arranged to receive a first voltage from a supplied voltage;
a second transformer winding coupled to the first transformer winding;
a second capacitor having a first end and a second end, wherein the second transformer winding comprises a first end directly connected to the first end of the second capacitor, a second end directly connected to the second end of the second capacitor and a second center tap arranged to receive a second voltage; and
a negative resistance element directly connected to both ends of the second transformer winding to provide a negative resistance, wherein the first voltage is equal to a second voltage.

14. A voltage controlled oscillator, comprising:
a first capacitor having a first end and a second end;
a first transformer winding having a first end directly connected to the first end of the first capacitor, a second end directly connected to the second end of the first capacitor and a first center tap arranged to receive a first voltage;
a second transformer winding coupled to the first transformer winding, wherein an inductance value of the second transformer winding is greater than an inductance value of the first transformer winding, wherein the second transformer winding comprises a first end directly connected to a first end of a second capacitor, a second end directly connected to a second end of the second capacitor, and a second center tap arranged to receive a second voltage equal to the first voltage; and
a negative resistance element directly connected to both ends of the second transformer winding to provide a negative resistance.

* * * * *